US010008656B1

(12) United States Patent
Radhakrishnan

(10) Patent No.: US 10,008,656 B1
(45) Date of Patent: Jun. 26, 2018

(54) PIEZO ACTUATOR DRIVER WITH SLEW RATE PROTECTION

(71) Applicant: TEXAS INSTRUMENTS INCORPORATED, Dallas, TX (US)

(72) Inventor: Madhan Radhakrishnan, Bengaluru (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days. days.

(21) Appl. No.: 15/803,923

(22) Filed: Nov. 6, 2017

(30) Foreign Application Priority Data

Dec. 22, 2016 (IN) .............................. 201641043834

(51) Int. Cl.
| H01L 41/04 | (2006.01) |
| H02N 2/06 | (2006.01) |
| H03F 3/45 | (2006.01) |

(52) U.S. Cl.
CPC ............ *H01L 41/042* (2013.01); *H02N 2/06* (2013.01); *H03F 3/4521* (2013.01); *H03F 2203/45026* (2013.01); *H03F 2203/45288* (2013.01)

(58) Field of Classification Search
CPC ... H01L 41/042; H01L 2924/14; H01L 41/09; H01L 41/22
USPC ......... 318/116, 671, 678, 679; 310/311, 318
See application file for complete search history.

(56) References Cited

U.S. PATENT DOCUMENTS

| 4,644,212 A | * | 2/1987 | Moritugu | ............ | F02D 41/2096 |
| | | | | | 310/317 |
| 6,486,587 B2 | * | 11/2002 | Klenk | ................. | F02D 41/2096 |
| | | | | | 310/316.03 |
| 6,847,881 B2 | * | 1/2005 | Melbert | .............. | F02D 41/2096 |
| | | | | | 123/446 |
| 7,034,437 B2 | * | 4/2006 | Fukagawa | ........... | F02D 41/2096 |
| | | | | | 310/316.03 |
| 2015/0102750 A1 | * | 4/2015 | Park | ...................... | H01L 41/042 |
| | | | | | 318/116 |

* cited by examiner

*Primary Examiner* — Bentsu Ro
*Assistant Examiner* — Thai Dinh
(74) *Attorney, Agent, or Firm* — John R. Pessetto; Charles A. Brill; Frank D. Cimino

(57) ABSTRACT

A driver for a piezo actuator includes a transconductance amplifier to produce an output current, a slew rate-controlled amplifier, and a logic gate. The logic gate receives a first control signal to cause the transconductance amplifier to transition to a high impedance mode, receive a compare signal indicative of the amplitude of the output current produced by the transconductance amplifier being less than a threshold, and generate a second control signal to the transconductance amplifier responsive to the first control signal indicating the high impedance mode for the transconductance amplifier and the compare signal indicative of the output current being less than the threshold. A voltage is provided to the slew rate-controlled amplifier upon assertion of the first control signal, wherein the voltage causes the slew rate controlled amplifier to generate a voltage to the transconductance amplifier that causes the transconductance amplifier's output to fall below the threshold.

20 Claims, 5 Drawing Sheets

PIEZO ACTUATOR DRIVER WITH SLEW RATE PROTECTION

RELATED APPLICATIONS

This application claims priority to India Provisional Application No. 201641043834, filed Dec. 22, 2016, which is hereby incorporated by reference.

BACKGROUND

An actuator is a device that converts input energy into mechanical energy. Various types of actuators are available for a variety of applications. For example, piezoelectric actuators (referred to herein as piezo actuators) achieve displacement by directly applying an electrical signal to a solid material (typically a crystal or ceramic material). Piezo actuators feature relatively high displacement accuracy, large force generation and high response times. Applications for the use of piezo actuators include, for example, industrial equipment requiring precision position control such as ultra-fine-movement stage of semiconductor exposure systems, precision positioning strobes for scanning tunnel microscopy, printers, etc.

A piezo actuator may be driven by an amplifier such as a voltage mode amplifier or a transconductance amplifier. A transconductance amplifier generally provides better linearity performance than a voltage mode driver. The velocity of the movement of the piezo actuator is proportional to the current through the actuator. If it is desired for the piezo actuator to stop moving, the current should be set to zero current (i.e., turned off). However, a sudden change in current with respect to time (i.e., high di/dt) can damage the piezo actuator. There are other reasons for turning off current to a piezo actuator. For example, a user may want to sense the piezo actuator's parameters such as voltage, position, leakage current, etc. During such sensing, the current to the actuator should be ceased. However, as noted above, a sudden change in piezo actuator current can be harmful to the device.

SUMMARY

In an embodiment, a driver for a piezo actuator includes a transconductance amplifier configured to produce an output current, a slew rate-controlled amplifier including an input and output wherein the output is coupled to an input of the transconductance amplifier, and a logic gate. The logic gate is configured to receive a first control signal to cause the transconductance amplifier to transition to a high impedance mode, receive a compare signal indicative of the amplitude of the output current produced by the transconductance amplifier being less than a threshold, and generate a second control signal to the transconductance amplifier responsive to the first control signal indicating the high impedance mode for the transconductance amplifier and the compare signal indicative of the output current being less than the threshold. A voltage is provided to the slew rate-controlled amplifier upon assertion of the first control signal, wherein the voltage causes the slew rate controlled amplifier to generate a voltage input to the transconductance amplifier that causes the output current from the transconductance amplifier to fall below the threshold.

In another embodiment, a driver for a piezo actuator includes a first amplifier configured to produce an output current based on an input voltage to the first amplifier and a second amplifier including an output. The output of the second amplifier is coupled to an input of the first amplifier. Based on an input voltage to the second amplifier, the second amplifier produces an output voltage at a predetermined slew rate. The driver also includes a voltage selection circuit configured to selectively provide, based on a first control signal and as the input voltage to the second amplifier, an input voltage to the driver or a voltage that corresponds to the output current from the first amplifier being below a threshold. The driver further includes a comparator and a logic gate. The comparator is configured to compare a voltage indicative of the output current from the first amplifier to the threshold to thereby generate a compare signal responsive to the voltage indicative of the output current being less than the threshold. The logic gate is configured to gate the first control to the first amplifier based on the compare signal from the comparator to thereby control the transition of the first amplifier into a high impedance mode.

In yet another embodiment, a method for driving a piezo actuator includes driving a slew rate-controlled amplifier with a first voltage. Responsive to a first control signal, the method includes ceasing driving the slew rate-controlled amplifier with the first voltage and providing a second voltage to the slew rate-controlled amplifier that is coupled to an input of a transconductance amplifier coupled to the piezo actuator. The second voltage causes current produced by the transconductance amplifier to be below a threshold. The method further includes determining whether the current from the transconductance amplifier to the piezo actuator is below the threshold. Responsive to the current from the transconductance amplifier being below the threshold, the method includes transitioning the transconductance amplifier to a high impedance mode.

BRIEF DESCRIPTION OF THE DRAWINGS

For a detailed description of various examples, reference will now be made to the accompanying drawings in which.

DETAILED DESCRIPTION

The disclosed embodiments are directed to a driver for a piezo actuator. In one example, a transconductance driver is disclosed that drives a current to the actuator based on an input voltage. The driver is capable of turning off the current to the piezo actuator without risk of damaging the actuator which might otherwise occur if a sudden cessation of current occurred. The driver described herein receives an externally-generated control signal indicating that the driver is to be transitioned to a high impedance mode in which current to the actuator ceases. Internal circuitry within the driver includes a slew rate-controlled amplifier and a transconductance amplifier. The slew rate-controller amplifier ramps down a voltage to the transconductance amplifier at a predetermined slew rate thereby causing the transconductance amplifier to begin to decrease its output current to the piezo actuator at the same slew rate. A comparator within the driver detects when the driver's output current falls below a threshold and a logic gate detects when the externally-generated control signal is asserted and the output current is below the threshold. In response to both the output current being below the threshold and the externally-generated control signal being asserted, the logic gate asserts another control signal to the transconductance amplifier to transition the transconductance amplifier to the high impedance mode. As such, the transconductance amplifier is placed into the high impedance mode only after its output current has been reduced below a threshold in a gradual and controlled manner. Risk of damaging the piezo actuator is therefore reduced.

Figure 1:
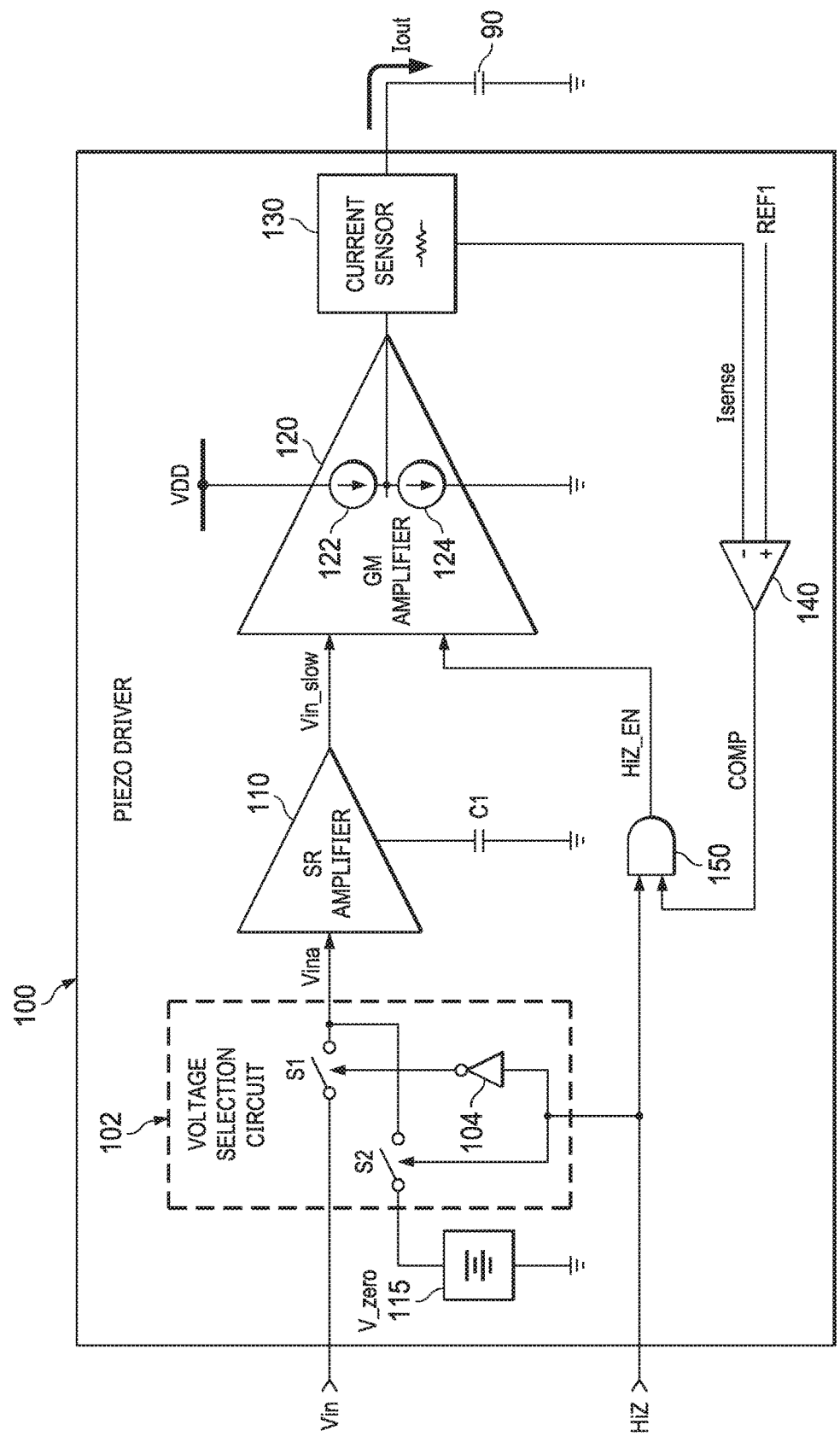
FIG. 1 illustrates a circuit implementation of a driver for a piezo actuator in accordance with a disclosed embodiment.

FIG. 1 shows one example of an implementation for a piezo driver 100 that drives a piezo actuator 90 (shown schematically as a capacitor). The piezo driver 100 is a current mode driver in this example and produces a current Iout to drive the actuator. The piezo driver receives an input voltage Vin and produces the output current Iout proportional to the input voltage Vin. The piezo driver 100 in this example also can receive a HiZ control signal to cause the piezo driver to be transitioned into a high impedance mode in which current is shut off to the piezo actuator.

FIG. 1 shows that the illustrative piezo driver 100 includes a voltage selection circuit 102, a slew rate (SR)-controlled amplifier 110 (referred to herein as the SR amplifier 110), an internal voltage generator 115, a transconductance amplifier 120 (also referred to as a gm amplifier), a current sensor 130, a comparator 140, and a logic gate 150. The voltage selection circuit 102 couples to the SR amplifier 110, and the SR amplifier 110 couples to the transconductance amplifier 120. The current sensor 130 couples to the output of the transconductance amplifier 120 and to an input of the comparator 140. Another input of the comparator 140 is coupled to a reference signal REF1 (e.g., a reference voltage). The output of the comparator 140 is coupled to an input of the logic gate 150. The output of the logic gate 150 is coupled to the transconductance amplifier 120.

The voltage selection circuit 102 receives the input voltage Vin to the piezo driver 100 as well as an internally-generated voltage V_zero from the internal voltage generator 115. Based on the HiZ signal, the voltage selection circuit 102 selects one of the voltages Vin or V_zero to be provided as an input Vina to the slew rate-controlled amplifier 110. During normal operation, the input voltage Vin is selected to be provided to the SR amplifier 110 and during the transition to the high impedance mode, the internally-generated voltage V_zero is provided to the SR amplifier 110. In the example shown in FIG. 1, the voltage selection circuit 102 includes switches S1 and S2 and inverter 104. The HiZ signal controls the state of S2. The logic state of HiZ is inverted by inverter 104 and the output of the inverter 104 controls the state of S1. Thus, when HiZ is one logic state, one of switches S1 and S2 is on and the other is off, and vice versa when HiZ is in the complementary logic state. For example, S1 may be on and S2 off when HiZ is a logic low, and S1 may be off and S2 on when HiZ is a logic high.

Figure 2:
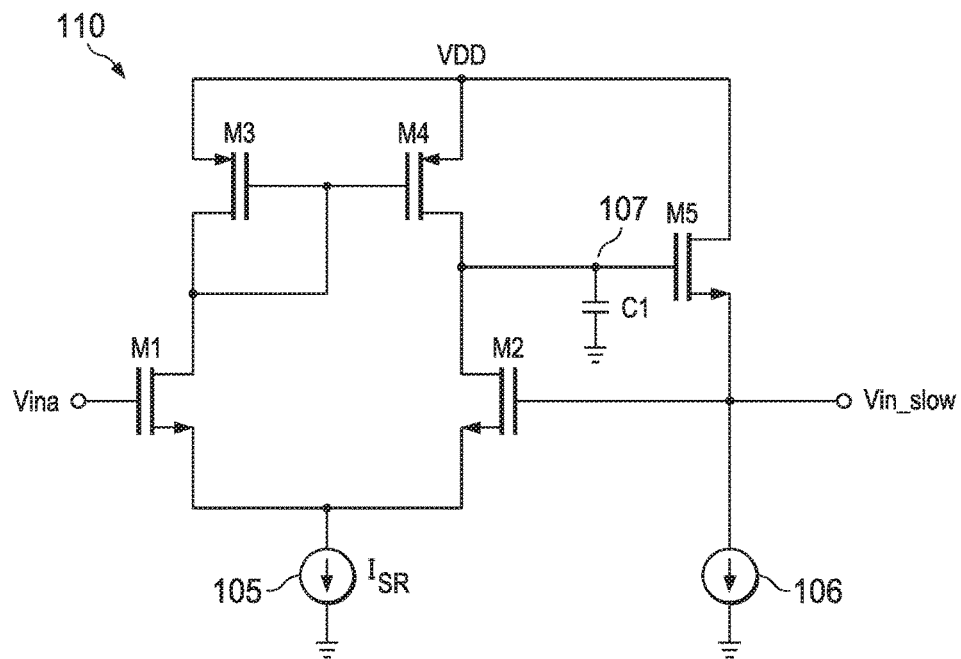
FIG. 2 shows an example of a slew rate-controlled amplifier usable in the driver of FIG. 1.

The SR amplifier 110 generates an output voltage Vin_slow that is proportional to its input voltage Vina but is slew rate limited. The magnitude of the slew rate is controlled, at least in part, by the capacitor C1 that is connected to the slew rate-controlled amplifier 110. FIG. 2 (discussed below) provides an example of a SR amplifier that is suitable for use in the piezo driver 110. The capacitor C1 is part of the slew rate-controlled amplifier 110.

Figure 3:
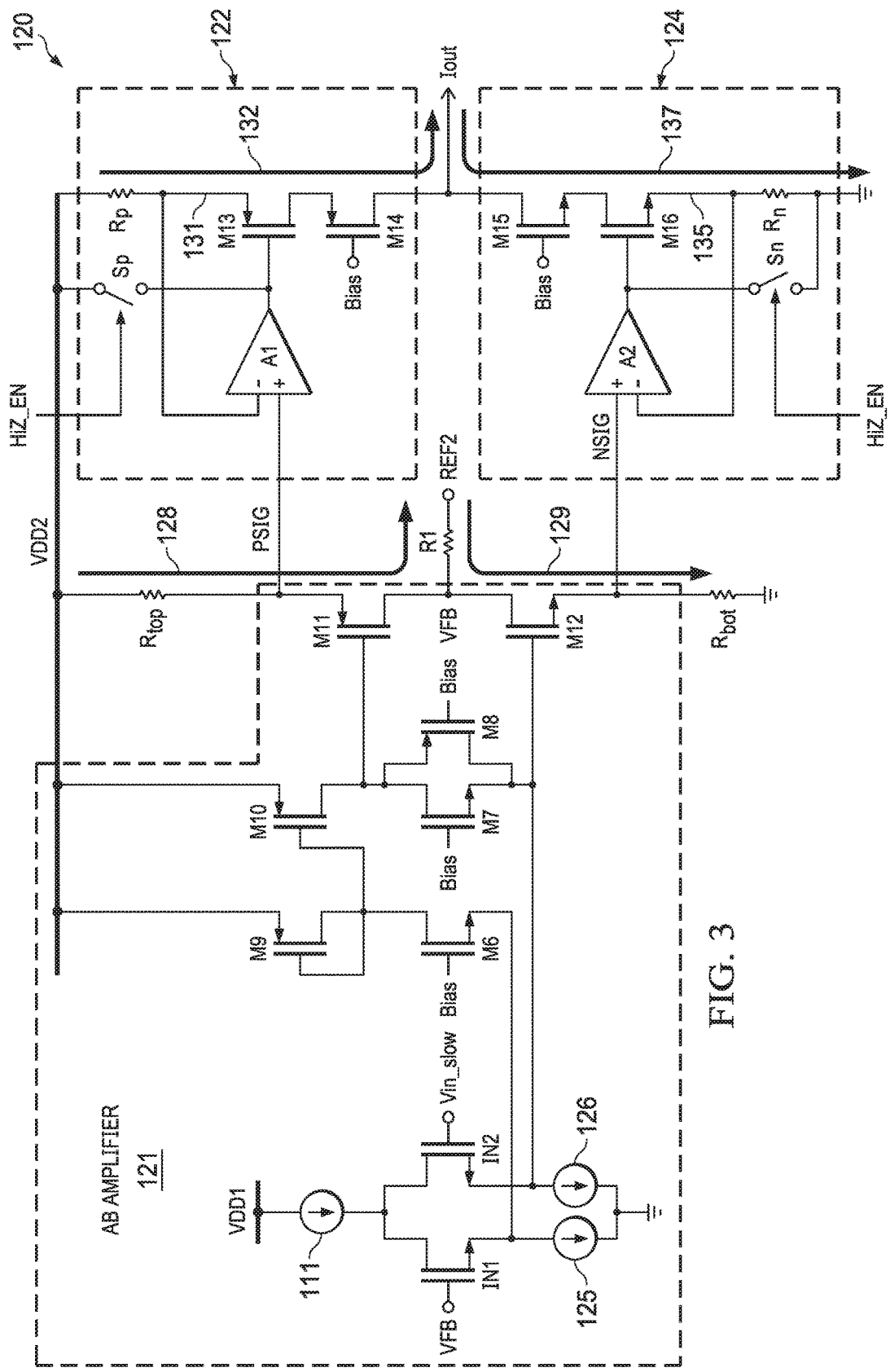
FIG. 3 shows an example of a transconductance amplifier usable in the driver of FIG. 1.

The slew rate-controlled output (Vin_slow) from the SR amplifier 110 is provided to the gm amplifier 120. The gm amplifier 120 produces an output current Iout that is proportional to its input voltage Vin_slow. The gm amplifier 120 includes a pair of current sources 122 and 124. Current source 122 sources current to the piezo actuator 90 and current source 124 sinks current from the piezo actuator. FIG. 3 includes an example of a circuit for implementing the gm amplifier 120 and will be discussed below.

Referring still to FIG. 1, when HiZ is in the deasserted logic state (i.e., in a logic state not to cause the piezo driver to transition to the high impedance state), S1 is closed and S2 is open thereby providing Vin as Vina to the SR amplifier 110. In the example described herein, a logic low for HiZ indicates that the piezo driver is not to be in the high impedance state and a logic high for HiZ indicates that the piezo driver is to be in the high impedance state. The meaning of the logic states for HiZ can be the opposite from that in other embodiments (i.e., logic high for HiZ indicates that the piezo driver is not to be in the high impedance state and a logic low indicates that the driver is to be in the high impedance state).

With HiZ low (piezo driver not to be in a high impedance/off state), the output signal HiZ_EN of the logic gate 150 (which is an AND gate in this example, but can be other than an AND gate in other embodiments) is a logic low which signals to a high impedance control input of the gm amplifier 120 that the gm amplifier should not be in the high impedance. With HiZ low, switch S1 is on (and S2 is off) and the gm amplifier is not in the high impedance state. As such, the SR amplifier 110 receives Vina, which through S1 is Vin, and produces Vin_slow to be proportional to Vin. The gm amplifier 120 receives Vin_slow (which is proportional to Vin) and produces a corresponding current to drive the piezo actuator 90.

The current sensor 130 senses the magnitude of the output current Iout. In one embodiment, the current sensor 130 comprises a low resistance sense resistor (e.g., less than 1 ohm) in series between the gm amplifier and the piezo actuator. The voltage across the sense resistor is proportional to Iout. The output signal from the current sensor 130 is designated as Isense and is a current sense signal that is compared to REF1 by voltage comparator 140. The Isense input is provided to the negative input of comparator 140 and REF1 is provided to the positive input of the comparator 140 in this example. The output signal from the comparator 140 is designated as COMP.

The gm amplifier 120 can only be transitioned to the high impedance state to shut off the output current Iout when HiZ_EN is asserted (e.g., asserted high). HiZ_EN is the output signal from the logic gate 150. Because the logic gate 150 is an AND gate, the only way HiZ_EN can be asserted high is when both inputs are high. Thus, both HiZ and COMP must be logic high for HIZ_EN to be a logic high and cause the gm amplifier to shut off Iout.

The reference signal REF1 is a predetermined voltage that corresponds to an Isense level that is indicative of Iout being nearly zero. When HiZ is asserted high (to cause piezo driver 100 to transition to the high impedance state), Iout may be at a high enough level that Isense is larger than REF1. With Isense being larger than REF1, COMP is low, and logic gate 150 thereby causes HiZ_EN to be low despite HiZ being asserted high. With HIZ_EN low, the gm amplifier 120 does not enter its high impedance mode.

Asserting HiZ high causes the state of switches S1 and S2 to change resulting in V_zero being provided as Vina to the SR amplifier 110. The voltage V_zero is a voltage that corresponds to, or approximately to, an output current Iout of 0. In one example, Vin may range from 0V for a maximum negative output Iout current (e.g., −10 mA) to +1V for a maximum positive output Iout current (e.g., +10 mA). A Vin voltage of 0.5 V in this example corresponds to 0 current. As such, the internal voltage generator 115 generates a V_zero voltage level of 0.5 V in this example. When HiZ changes state to a logic high, Vina changes from its current Vin voltage to V_zero thereby causing a step change in the input voltage to the SR amplifier 110. The SR amplifier 110, however, causes its output signal Vin_slow to ramp down at a more gradual rate than the step change in its input voltage—a rate that is controlled in part by C1. With Vin_slow ramping down (or uo) towards a voltage that would cause the gm amplifier 120 to generate zero Iout current, the gm amplifier responds by ramping down Iout towards zero commensurate with the slew rate of Vin_slow. The gradual reduction in Iout to or from the piezo actuator 90 avoids damage to the piezo actuator.

The Isense signal from the current sensor 130 also begins to fall as Iout begins to drop. Once Isense falls below REF1, COMP changes from a logic low signal to a logic high signal. At that point, both inputs to the logic 150 are high and HiZ_EN is thereby asserted high to the gm amplifier 120. HiZ_EN being asserted high causes the gm amplifier 120 to shut off the current to the piezo actuator 90. Thus, current is shut off to the piezo actuator but only after a decrease of the current in a controlled manner to avoid damage to the actuator.

FIG. 2 shows an example of an implementation of the SR amplifier 110. In this example, the SR amplifier 110 includes transistors M1-M6 and current sources 105 and 106. Transistors M1, M2, and M5 are n-type metal oxide semiconductor field effect transistors (nMOS) and transistors M3 and M4 are p-type metal oxide semiconductor field effect transistors (pMOS). The gate to M1 receives the input voltage Vina. The sources of M1 and M2 are coupled together and to current source 105 (whose current is designated as $I_{SR}$). M3 and M4 are configured as a current mirror. The drain of M1 is coupled to the drain of M3. The drains of M2 and M4 are coupled together and to the gate of M5 at a node 107. Capacitor C1 also couples to node 107.

At a steady state in which Vina is not changing, Vin_slow equals Vina. If Vina were to receive a step up in voltage, due to the current mirror formed by M3 and M4, current equal to $I_{SR}$ flows through M4 and charges the capacitor C1. Charging the capacitor C1 causes the voltage on C1, and thus on node 107, to ramp up at a rate that is proportional to the capacitance of C1. The voltage on node 107 also is provided as the gate to voltage to M5. The gate voltage to M5 functions to turn M5 on and off. By controlling the rate of increase (and decrease of M5's gate voltage), the rate at which M5 turns and off is controlled according to the slew rate implemented by C1. Accordingly, the output voltage from the SR amplifier 112 also ramps up and down at the same slew rate implemented by way of C1. Moreover, for a Vina voltage changing faster than the slew rate of the SR amplifier, the output voltage Vin_slow is slew-rate limited at a rate set, at least in part, by C1. For a Vina voltage changing lower than the slew rate of the SR amplifier, the slew rate of the SR amplifier does has no effect on the rate of change of Vin_slow. That is, the output Vin_slow of the SR amplifier is slew-rate limited due to capacitor C1. The capacitance value of C1 is application specific.

FIG. 3 shows an example of an implementation of the gm amplifier 120. In this example, the gm amplifier 120 includes a class AB amplifier 121 (in which the output transistors both conduct at the same time around the input waveform crossover point at 0V), resistors Rtop and Rbot, and current sources 122 and 124. The AB amplifier 121 includes an input pMOS transistor pair In1 and In2, a current source 111 from VDD1 to the sources of In1 and In2, and current sources 125 and 16 from the drains of In1 and In2, respectively, to ground. The AB amplifier also includes transistors M6, M7, M8, M9, M10, M11 and M12 coupled together as shown. M11 is a pMOS transistor and M12 is an nMOS transistor. The drain of M11 is coupled to the drain of M12 at a node labeled as VFB. VFB is also coupled to the gate of In1. The Vin_slow input from the SR amplifier 110 is provided to the gate of In2.

The current source 122 includes an operational amplifier A1 configured as a voltage follower, a resistor Rp and transistors M13 and M14. Similarly, current source 124 includes an operational amplifier A2 configured as a voltage follower, a resistor Rn and transistors M15 and M16. A resistor R1 couples VFB to a reference voltage REF2. Resistor Rtop couples VDD2 to the source of M11, and Rbot couples the source of M12 to ground. The gates of transistors M6, M7, M8, M14 and M15 are connected to bias voltages, which may be the same or different among these transistors.

In operation, VFB tracks and is approximately equal to Vin_slow. As Vin_slow increases, so does VFB, and vice versa. VFB couples to a reference voltage VREF2 through a resistor R1. As Vin_slow, for example, increases above REF2, VFB also increases above REF2. With VFB being greater than REF2, a current 128 flows through R1 from VDD2, through Rtop, M11, and R1 to REF2. The magnitude of the current is the voltage difference between VFB (and thus Vin_slow) and REF2 divided by the resistance of R1. Current 128 causes a voltage drop across Rtop so that the Rtop-to-M11 source node is at a voltage less than VDD2. The voltage at that node is designated as PSIG and is provided to the non-inverting input to operational amplifier A1 configured as a voltage follower. As a result, the PSIG voltage is also present at node 131. The voltage drop across Rp causes a current 132 to flow from VDD2 through Rp, transistors M13 and M14 as the output current Iout of the gm amplifier 120. With VFB being greater than REF2, current 132 is the output current from the amplifier and no current flows through current source 124.

As Vin_slow decreases below REF2, VFB also decreases below REF2. With VFB being less than REF2, a current 129 flows from REF2 and through R1, M12 and Rbot to ground. The magnitude of the current is the voltage difference between REF2 and VFB (and thus Vin_slow) divided by the resistance of R1. Current 129 causes a voltage drop across Rbot so that the M12 source-to-Rbot node is at a voltage less than VDD2. The voltage at that node is designated as NSIG and is provided to the non-inverting input to operational amplifier A2 configured as a voltage follower, which causes the NSIG voltage also to be present at node 131 and thus across resistor Rn. The voltage drop across Rn causes a current 137 to flow from the output node of the amplifier through M15, M16 and Rn to ground as the output current Iout of the gm amplifier 120. With VFB being smaller than REF2, current 137 is the output current from the amplifier and no current flows through current source 122.

The supply voltage VDD2 may be the same or different as VDD1. In one example, VDD2 is larger than VDD1. For example, VDD1 may be a 5V supply and VDD2 may be a 200V supply.

Referring still to FIG. 3, each of the current sources 122 and 124 have a switch which can be used to shut off the current to/from the piezo actuator as discussed above.

Switch Sp is shown in this example coupled between the gate of M13 and VDD2, and switch Sn couples the gate of M16 to ground. The state of the switches Sp and Sn are controlled by HiZ_EN. With HiZ_EN low, switches Sp and Sn are in their off state (open) and the gm amplifier 120 operates as described above to drive the piezo actuator 90. However, once HiZ_EN is asserted high (e.g., when HiZ is high and the COMP signal is high indicating that Iout has fallen below the threshold set by REF1), the switches Sp and Sn are turned on (closed). With Sp turned on, the gate voltage of the pMOS transistor M13 is pulled high to VDD2 thereby preventing M13 from being on and thus preventing any current flow from VDD2 through M13 and to the piezo actuator. Similarly, with Sn turned on, the gate voltage of the nMOS transistor M16 is pulled low thereby preventing M16 from being on and thus preventing any current from the piezo actuator through transistors M15 and M16. With both Sp and Sn turned on due to HiZ_EN being asserted high, no drive current for the piezo actuator 90 is possible.

Figure 4:
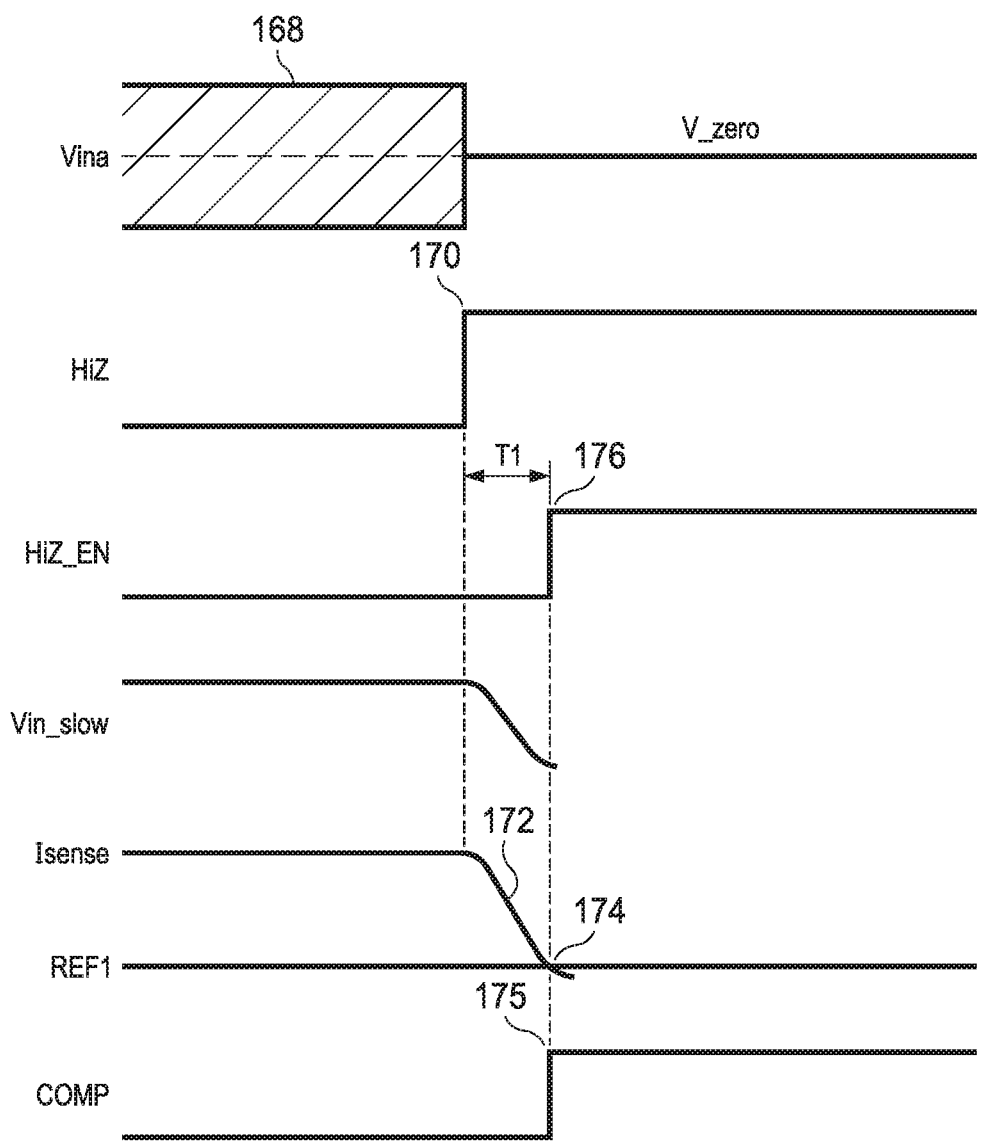
FIG. 4 illustrates a timing diagram of various signals in the driver.

FIG. 4 illustrates a timing diagram. The signals depicted in FIG. 4 include Vina, HiZ, HiZ_EN, Vin_slow, Isense, REF1, and COMP. At 168, Vina is at whatever voltage level is desired to drive a corresponding amount of current to the piezo actuator 90. The HiZ signal is low during this operation of the piezo driver. At 170, however, HiZ is asserted high to signal to the piezo driver 100 that current to the piezo actuator 90 should be turned off. Assertion of HiZ to a logic high causes Vina to become the V_zero voltage level due to the change of state of switches S1 and S2 in FIG. 1. Forcing Vina to become V_zero causes Vin_slow to drop as shown in accordance with the slew rate implemented by the SR amplifier 110 and the output current Iout to fall towards 0 amperes as indicated by the falling Isense signal at 172. Once Isense falls below REF1, the logic gate 150 of causes COMP to be asserted high at 175 thereby causing HiZ_EN to be asserted high at 176. Assertion of HiZ_EN to a logic high causes the gm amplifier to shut off its output current sources 122 and 124 as explained above. The time delay between assertion of HiZ to a logic high state and the assertion of HiZ_EN to the logic high state is represented as T1 in FIG. 4. The length of T1 is a function of the slew rate implemented by the SR amplifier 110, the initial Isense signal level when HiZ is asserted high, and the voltage level chosen for REF1.

Figure 5:
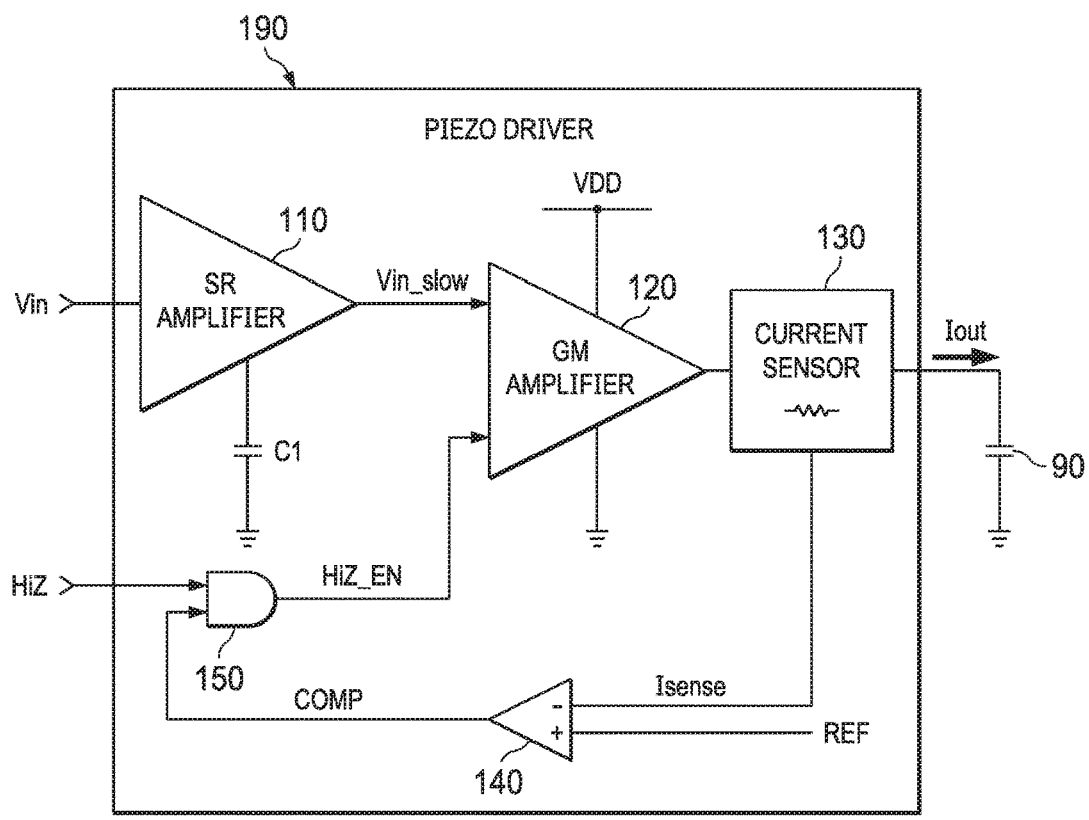
FIG. 5 shows an alternative embodiment of a driver for a piezo actuator.

FIG. 5 is an embodiment of a piezo driver 190 that is similar to that of FIG. 1 in that FIG. 5 also includes the SR amplifier 110, gm amplifier 120, current sensor 130, comparator 140, and logic gate 150 (e.g., AND gate). Whereas the driver 100 of FIG. 1 includes an internal voltage generator 115 to generate the V_zero voltage and a voltage selection circuit 102 to select between Vin and V_zero as the Vina voltage to the SR amplifier 110, the piezo driver 190 of FIG. 5 lacks the internal voltage generator 115 and the voltage selection circuit 102. Instead, circuitry external to the piezo driver 190 provides the input voltage for normal operation of the driver 190 as well as the V_zero voltage to shut off the driver's output current when asserting HiZ high. That is, when it is desired to turn off the output current Iout to the piezo actuator, the input voltage to the driver is changed to V_zero and HiZ is asserted high.

Figure 6:
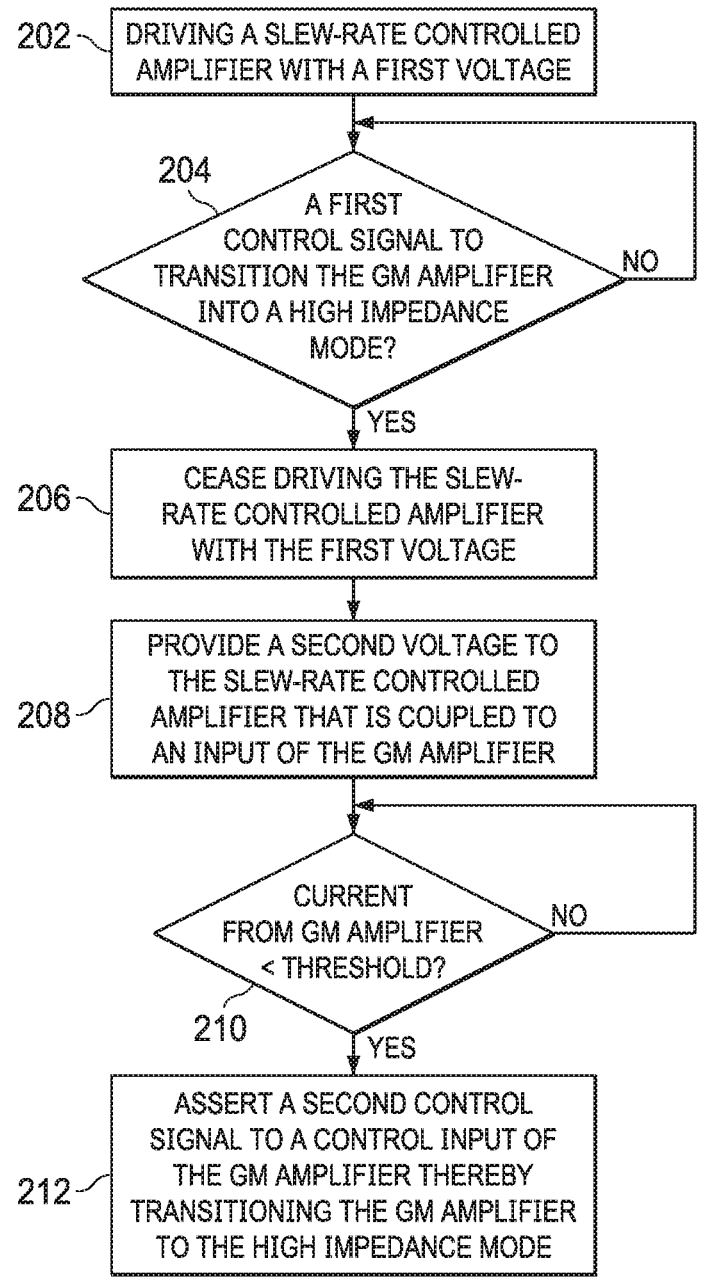
FIG. 6 shows a method for transitioning a piezo actuator driver into a high impedance mode.

FIG. 6 shows an example of a method for operating a piezo actuator. At 202, the method includes driving a slew-rate controlled amplifier coupled to the piezo actuator through a transconductance amplifier with a first voltage. This operation may be performed using a gm amplifier such as the gm amplifier 120 described herein. At 204, the method includes determining whether a first control signal (e.g., the HiZ signal) is asserted to a state to cause the transconductance amplifier to transition into a high impedance mode and thus shut off the output current to the piezo actuator). If the first control signal is detected, then the method further includes at 206 ceasing driving the slew rate-controlled amplifier with the first voltage. This operation may include turning off the input voltage to the slew-rate controlled amplifier such as through the use of voltage selection circuit 102.

The method includes at 208 providing a second voltage to the slew rate-controlled amplifier that is coupled to an input of the transconductance amplifier. The second voltage causes current produced by the current mode amplifier to be below a threshold. In the examples described above, the second voltage is the V_zero voltage. Due to the slew rate limit of the SR amplifier 110, the output current from the driver falls towards zero. At 210, the method includes determining whether the current from the transconductance amplifier to the piezo actuator is below the threshold. Responsive to the current from the transconductance amplifier being below the threshold, at 212 the method includes transitioning the transconductance amplifier to a high impedance mode. This operation may be performed by turning off operation of current sources within the transconductance amplifier.

Certain terms have been used throughout this description and claims to refer to particular system components. As one skilled in the art will appreciate, different parties may refer to a component by different names. This document does not intend to distinguish between components that differ in name but not function. In this disclosure and claims, the terms "including" and "comprising" are used in an open-ended fashion, and thus should be interpreted to mean "including, but not limited to . . . ." Also, the term "couple" or "couples" is intended to mean either an indirect or direct wired or wireless connection. Thus, if a first device couples to a second device, that connection may be through a direct connection or through an indirect connection via other devices and connections. The recitation "based on" is intended to mean "based at least in part on." Therefore, if X is based on Y, X may be a function of Y and any number of other factors.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:
1. A driver for a piezo actuator, comprising:
a transconductance amplifier configured to produce an output current;
a slew rate-controlled amplifier including an output, wherein the output is coupled to an input of the transconductance amplifier; and
a logic gate configured to:
receive a first control signal to cause the transconductance amplifier to transition to a high impedance mode;
receive a compare signal indicative of an amplitude of the output current produced by the transconductance amplifier being less than a threshold; and
generate a second control signal to the transconductance amplifier responsive to the first control signal indicating the high impedance mode for the transconductance amplifier and the compare signal indicative of the output current being less than the threshold;

wherein a voltage is provided to the slew rate-controlled amplifier upon assertion of the first control signal, wherein the voltage causes the slew rate-controlled amplifier to generate a voltage input to the transconductance amplifier that causes the output current from the transconductance amplifier to fall below the threshold.

2. The driver of claim 1, further comprising a voltage selection circuit configured to selectively provide, as the voltage to the slew rate-controlled amplifier, an input voltage to the driver or a voltage that corresponds to the output current from the transconductance amplifier being below the threshold.

3. The driver of claim 2, wherein:
the voltage selection circuit comprises a first switch coupled to the input voltage and an input of the slew rate-controlled amplifier and a second switch coupled to the voltage that corresponds to the output current from the transconductance amplifier being below the threshold;
the first and second switches are operable based on a state of the first control signal.

4. The driver of claim 1, further comprising:
a current sensor coupled to an output of the transconductance amplifier and configured to generate a current sense signal (FIG. 1, Isense, para 22) indicative of the output current from the transconductance amplifier; and
a comparator coupled to the current sensor and configured to compare the current sense signal to a reference signal to thereby generate the compare signal.

5. The driver of claim 4, wherein the compare signal from the comparator is coupled to an input of the logic gate, and wherein the logic gate is configured to cause the transconductance amplifier to transition to a high impedance mode based on states of the compare signal and the first control signal.

6. The driver of claim 5, wherein the logic gate is an AND gate that is configured to generate the second control signal to the transconductance amplifier based on a high logic state of the compare signal and a high logic state of the first control signal.

7. The driver of claim 1, wherein the logic gate is an AND gate.

8. The driver of claim 1, wherein the slew rate-controlled amplifier includes a capacitor coupled to a gate of a first transistor, wherein the capacitor is charged by a current from a second transistor.

9. The driver of claim 1, further comprising an internal voltage generator to generate the voltage provided to the slew rate-controlled amplifier upon assertion of the first control signal.

10. A driver for a piezo actuator, comprising:
a first amplifier configured to produce an output current based on an input voltage to the first amplifier;
a second amplifier including an output, wherein the output is coupled to an input of the first amplifier, and wherein, based on an input voltage to the second amplifier, the second amplifier produces an output voltage at a predetermined slew rate;
a voltage selection circuit configured to selectively provide as the input voltage to the second amplifier and based on a first control signal, an input voltage to the driver or a voltage that corresponds to the output current from the first amplifier being below a threshold;
a comparator configured to compare a voltage indicative of the output current from the first amplifier to the threshold to thereby generate a compare signal responsive to the voltage indicative of the output current being less than the threshold; and
a logic gate configured to gate the first control to the first amplifier based on the compare signal from the comparator to thereby control a transition of the first amplifier into a high impedance mode.

11. The driver of claim 10, wherein, responsive to the compare signal indicative of the output current being less than the threshold, the logic gate is configured to assert a second control signal to a high impedance control input of the second amplifier.

12. The driver of claim 10, wherein the voltage selection circuit comprises a first switch coupled to the input voltage of the driver and to an input of the second amplifier.

13. The driver of claim 12, wherein the voltage selection circuit further comprises a second switch coupled to the voltage that corresponds to the output current from the first amplifier being below the threshold.

14. The driver of claim 13, wherein the first and second switches are operable based on a state of the first control signal.

15. The driver of claim 10, wherein the logic gate is an AND gate.

16. The driver of claim 10, further comprising a current sensor coupled to an output of the first amplifier and to the comparator, wherein the current sensor is configured to produce the voltage indicative of the output current from the first amplifier.

17. A method of driving a piezo actuator, comprising:
driving a slew rate-controlled amplifier with a first voltage;
responsive to a first control signal, ceasing driving the slew rate-controlled amplifier with the first voltage;
providing a second voltage to the slew rate-controlled amplifier that is coupled to an input of a transconductance amplifier coupled to the piezo actuator, wherein the second voltage causes current produced by the transconductance amplifier to be below a threshold;
determining whether the current from the transconductance amplifier to the piezo actuator is below the threshold; and
responsive to the current from the transconductance amplifier being below the threshold, transitioning the transconductance amplifier to a high impedance mode.

18. The method of claim 17, wherein determining whether the current from the transconductance amplifier to the piezo actuator is below the threshold comprises sensing a magnitude of the current from the transconductance amplifier with a current sensor and comparing, using a voltage comparator, an output signal from the current sensor to the threshold.

19. The method of claim 17, wherein transitioning the transconductance amplifier to a high impedance mode comprises asserting a second control signal to a high impedance control input of the transconductance amplifier.

20. The method of claim 17, wherein ceasing driving the slew rate-controlled amplifier with the first voltage and providing the second voltage to the slew rate-controlled amplifier comprises turning off a first switch coupling the first voltage to the slew rate-controlled amplifier and turning on a second switch coupling the second voltage to the slew rate-controlled amplifier.

* * * * *